(12) United States Patent
Fujii

(10) Patent No.: US 10,818,617 B2
(45) Date of Patent: Oct. 27, 2020

(54) FLANGE MOUNT MILLIMETER-WAVE PACKAGE

(71) Applicant: MACOM Technology Solutions Holdings, Inc., Lowell, MA (US)

(72) Inventor: Kohei Fujii, San Jose, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 140 days.

(21) Appl. No.: 16/146,302

(22) Filed: Sep. 28, 2018

(65) Prior Publication Data

US 2020/0105686 A1 Apr. 2, 2020

(51) Int. Cl.
| | |
|---|---|
| *H01L 23/66* | (2006.01) |
| *H01L 23/00* | (2006.01) |
| *H03F 3/195* | (2006.01) |
| *H01L 23/043* | (2006.01) |

(52) U.S. Cl.
CPC ............ *H01L 23/66* (2013.01); *H01L 23/043* (2013.01); *H01L 24/49* (2013.01); *H03F 3/195* (2013.01); *H01L 2223/6683* (2013.01); *H01L 2924/1423* (2013.01)

(58) Field of Classification Search
CPC ....... H01L 24/49; H01L 23/66; H01L 23/043; H01L 2924/1423; H01L 2223/6683; H01L 2223/66; H01L 2223/6694; H01L 2223/6688; H03F 3/195
See application file for complete search history.

(56) References Cited

U.S. PATENT DOCUMENTS

| | | | | |
|---|---|---|---|---|
| 2014/0028518 | A1* | 1/2014 | Arnold ................ | H01Q 1/2283 343/841 |
| 2015/0015453 | A1* | 1/2015 | Puzella .............. | H01Q 21/0025 343/853 |
| 2015/0311576 | A1* | 10/2015 | Kuwabara ............... | H01L 23/66 257/664 |
| 2016/0050744 | A1* | 2/2016 | Lee ...................... | H05K 1/0206 361/712 |
| 2018/0240762 | A1* | 8/2018 | Kamgaing .............. | H01L 23/66 |

* cited by examiner

*Primary Examiner* — Stephen M Bradley
*Assistant Examiner* — Gustavo G Ramallo
(74) *Attorney, Agent, or Firm* — Thomas | Horstemeyer, LLP; Jason M. Perilla

(57) ABSTRACT

Examples of a package for a flange mount device are described. In one example, the package includes a thermally conductive base, a base substrate, and a lid having a cavity. The base substrate includes a through hole and radio frequency (RF) input, RF output, and bias traces that extend to a perimeter of the through hole. The lid includes a cavity and RF input coupling, RF output coupling, and bias coupling traces. A device can be secured to the thermally conductive base, and the lid can be secured to the thermally conductive base, with the base substrate secured between the lid and the thermally conductive base, coupling the traces of the base substrate to the traces of the lid. Other components, such as biasing, blocking, and bypassing components can be easily integrated into the package. Impedance matching and electromagnetic shielding components can also be easily integrated into the package.

20 Claims, 6 Drawing Sheets

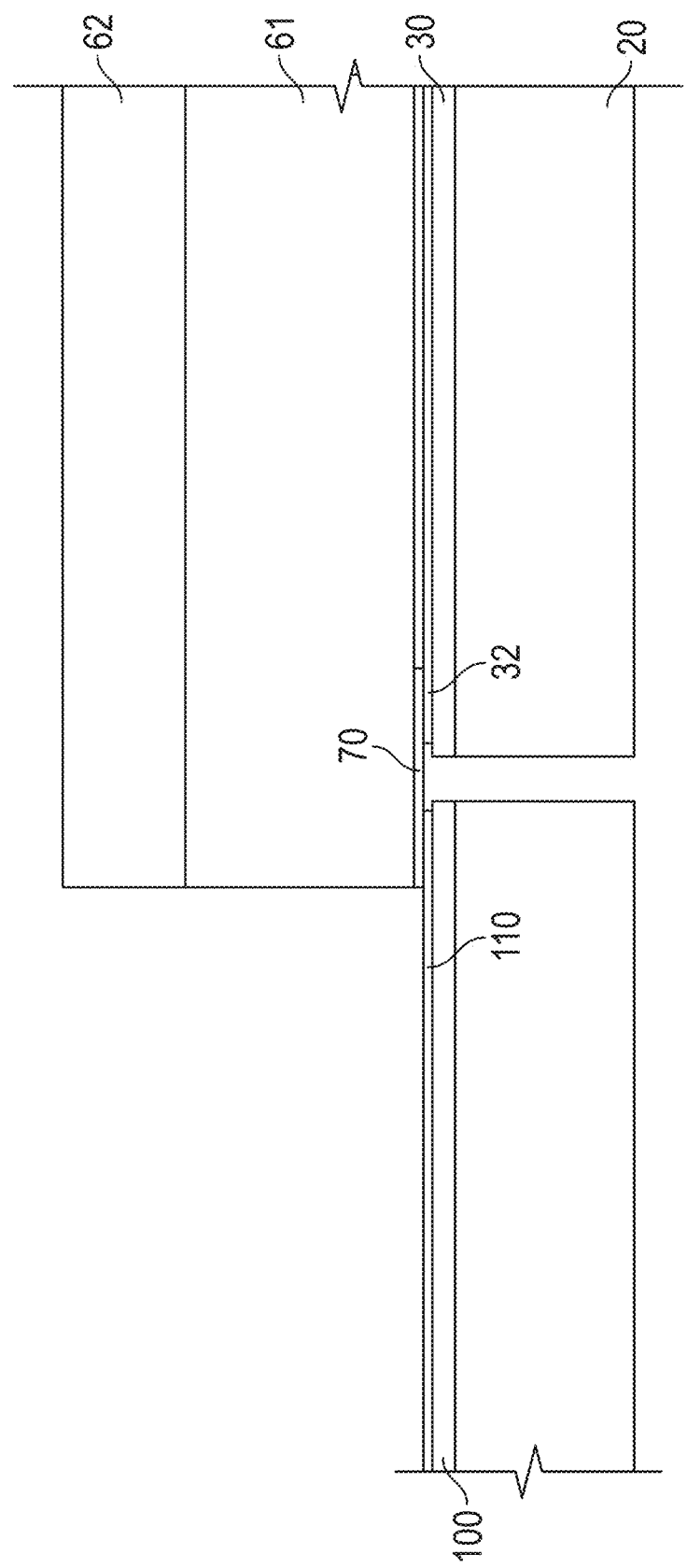

FLANGE MOUNT MILLIMETER-WAVE PACKAGE

BACKGROUND

Various types of packages are available for electrical components, integrated circuits, and circuit assemblies. The packages can both protect and secure the components and provide electrically conductive leads or contacts for electrical connections to larger circuits. Such packages can be surface mounted, through-hole mounted, or inserted into printed circuit boards, for example. The type, size, contact style, and materials of a package for a device can be chosen based on the components being housed within the package and the application in which the device is being used, among other factors.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

FIG. 4 illustrates a cross-sectional side view, designated A-A in FIG. 5, of an application circuit and the package shown in FIG. 1 according to various embodiments described herein.

DETAILED DESCRIPTION

As noted above, various types of packages are available for electrical components, integrated circuits, and circuit assemblies. The packages can both protect and secure the components and provide electrically conductive leads or contacts for electrical connections to larger circuits. Such packages can be surface mounted, through-hole mounted, or inserted into printed circuit boards, for example. The type, size, contact style, and materials of a package for a device can be chosen based on the components being housed within the package and the application in which the device is being used, among other factors.

Optimized packages are often needed for monolithic microwave integrated circuit (MMIC) power amplifiers. Flange mount packages have been widely used for high-power MMIC amplifiers. Metal interconnects and solder have been relied upon to electrically couple these flange mount packages to larger application circuits. The use of metal interconnects and solder for the assembly and connection of flange mount packages has proven to be relatively difficult, time consuming, and costly in prior solutions. Thus, the prior solutions have not been very suitable for high-volume commercial applications.

In the context outlined above, various examples of a new style of package for MMIC power amplifiers and other devices are described herein. In one example, the package includes a thermally conductive base, a base substrate, and a lid having a cavity. The base substrate includes a through hole and radio frequency (RF) input, RF output, and bias traces that extend to a perimeter of the through hole. The lid includes a cavity, an RF input coupling trace, an RF output coupling trace, and bias coupling traces. A device can be secured to the thermally conductive base, and the lid can be secured over the thermally conductive base, with the base substrate secured between the lid and the thermally conductive base. The traces of the base substrate can be coupled to the traces of the lid when the package is assembled. The traces of the lid can be electrically connected to a larger application circuit when the package is incorporated with the circuit. Other components, such as biasing, blocking, and bypassing components can be easily integrated into the package. Further, impedance matching and electromagnetic shielding components can also be easily integrated into the package.

Figure 1:
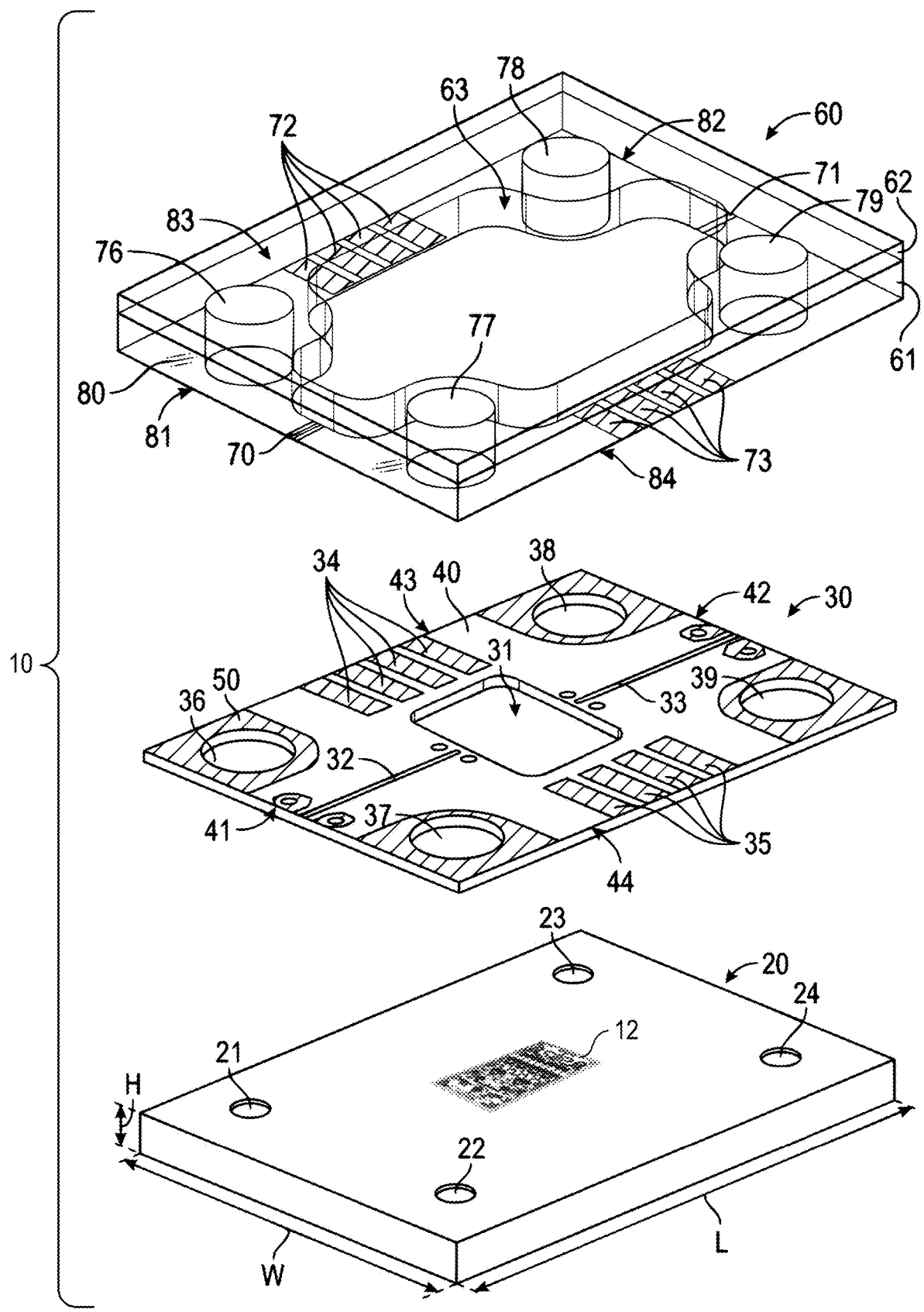
FIG. 1 illustrates example components of a package for a flange mount device according to various embodiments described herein.

Turning to the figures, FIG. 1 illustrates example components of a package 10 for a flange mount device 12 according to various embodiments described herein. The device 12 can be embodied as a compact high power MMIC power amplifier. As one example, the device 12 can be designed to operate in the band of microwave frequencies from about 300 Mhz to about 300 Ghz, but the package 10 is not limited to use with any particular type of device or device operating at any particular range of frequencies. Thus, while the package 10 is designed to provide certain benefits for MMIC power amplifiers, the package 10 can be used as a package for other types of devices.

The package 10 includes a thermally conductive base 20, a base substrate 30, and a lid 60. When assembled, the device 12 can be secured to the base 20 using a thermally conductive epoxy, solder, one or more mechanical fasteners, or other adhering or fastening means. Further, the lid 60 can be secured to the base 20 using one or more mechanical fasteners, with the base substrate 30 positioned between the lid 60 and the base 20 as described in further detail below. Additionally, the pins or contacts of the device 12 can be electrically coupled to the base substrate 30 by wire bonds, solder connections, or other suitable electrical connections, and certain electrical contacts can be made between the base substrate 30 and the lid 60 as described below.

The base 20 can be embodied as a thermally conductive base or slug formed of copper, aluminum, other thermally-conductive metals or metal alloys, or other suitable thermally-conductive materials. The base 20 can include a number of threaded apertures 21-24 for mechanically coupling the lid 60 to the base 20, with the base substrate 30 positioned between the lid 60 and the base 20 as described detail below.

The dimensions of the base 20, including the length (L), width (W), and height (H) of the base 20, can vary among the embodiments based on various factors, including the size of the device 12, the power (and power dissipation) of the device 12, and other factors. Similar dimensions of the base substrate 30 and the lid 60 can also vary among the embodiments based on similar factors, among others.

As described in further detail below with reference to FIGS. 4A and 4B, the length and width of the lid 60 can be larger than that of the base 20 and the base substrate 30. Thus, the peripheral footprint of the base 20 and the base substrate 30 can be smaller than a peripheral footprint of the lid 60. This permits traces formed on the underside of the lid 60 to extend out beyond the peripheral side edges of the base 20 and the base substrate 30, for interconnection with a larger application circuit as described below.

The base substrate 30 can be embodied as a printed circuit board (PCB) formed of one or more layers of a non-conductive laminate material of suitable dielectric constant, loss factor, strength, and expansion coefficient, such as paper-, epoxy-, glass- or fiberglass-reinforced polytetrafluoroethylene (PTFE) (e.g., Teflon®), among other suitable materials, with one or more layers of conductive traces, pads, or other features etched from one or more layers of copper between the layers of a non-conductive laminate material. The base substrate 30 shown in FIG. 1 is single-sided (i.e., one copper layer) and includes a number of copper traces on one side 40, but the use of double-sided or multi-layer substrates are within the scope of the embodiments.

As illustrated in FIG. 1, the base substrate 30 is provided as a representative example. The base substrate 30 can include additional or fewer traces than those shown and described below. For example, the base substrate 30 can include additional traces for components, such as biasing, blocking, and bypassing components, that can be electrically connected on the base substrate 30.

The base substrate 30 includes a through hole 31, an RF input trace 32, an RF output trace 33, bias traces 34 and 35, and mounting apertures 36-39. The through hole 31 is an opening through all the layers of the base substrate 30. When the base substrate 30 is secured on the base 20, the device 12 is positioned and fits within the perimeter or peripheral edge of the through hole 31. The size and position of the through hole 31, as illustrated in FIG. 1, is representative. The through hole 31 can be formed in other shapes and sizes and positioned at other locations as compared to that shown.

During assembly of the package 10 with the device 12, an RF input of the device 12 can be electrically coupled to the RF input trace 32, and an RF output of the device 12 can be electrically coupled to the RF output trace 33. For example, the RF input of the device 12 can be electrically coupled to the RF input trace 32 by wire bonds, solder connections, or other suitable electrical connections, and the RF output of the device 12 can be electrically coupled to the RF output trace 33 by wire bonds, solder connections, or other suitable electrical connections.

In one example, the RF input trace 32 extends from a first edge 41 of the side 40 of the base substrate 30 to a perimeter of the through hole 31, and the RF output trace 33 extends from a second edge 42 of the side 40 of the base substrate 30 to the perimeter of the through hole 31. In other examples, the outer ends of each of the RF traces 32 and 33 can extend nearly or about to the edges 41 and 42 of the base substrate 30, respectively, and the inner ends of each of the RF traces 32 and 33 can extend nearly or about to opposing sides of the perimeter of the through hole 31, respectively. However, the lengths and positions of the RF traces 32 and 33 on the base substrate 30 can vary among the embodiments. Similarly, the widths and thicknesses of the RF traces 32 and 33 can vary as compared to that shown in FIG. 1. In some cases, the base substrate 30 can also include networks of compensation patches for one or both of the RF traces 32 and 33 as described in further detail below with reference to FIG. 2A.

The bias traces 34 and 35 on the base substrate 30 can include electrical contacts for various power, ground, and control signals of the device 12. During assembly of the package 10 with the device 12, bias inputs and outputs of the device 12 can be electrically coupled to one or more of the bias traces 34 and 35 on the base substrate 30. For example, one or more bias contacts of the device 12 can be electrically coupled to one or more of the bias traces 34 and 35 by wire bonds, solder connections, or other suitable electrical connections.

In one example, the bias traces 34 and 35 extend, respectively, from a third edge 43 and a fourth edge 44 of the side 40 of the base substrate 30 to the perimeter of the through hole 31. In other examples, the outer ends of each of the bias traces 34 and 35 can extend nearly or about to the edges 43 and 44 of the base substrate 30, respectively, and the inner ends of each of the bias traces 34 and 35 can extend nearly or about to opposing sides of the perimeter of the through hole 31, respectively. However, the lengths of the bias traces 34 and 35 on the base substrate 30 can vary among the embodiments. Similarly, the widths and thicknesses of the bias traces 34 and 35 can vary as compared to that shown in FIG. 1.

The mounting apertures 36-39 are openings through all the layers of the base substrate 30. In one example, mechanical fasteners, such as plastic or metal screws, can be passed through the lid 60, through the mounting apertures 36-39, and fastened into the threaded apertures 21-24 of the base 20. One or more of the mounting apertures 36-39 can be surrounded by an eyelet, such as the eyelet 50, formed of copper or other metal layer material of the base substrate 30. The number and positions of the mounting apertures 36-39 can vary from that shown in FIG. 1.

The lid 60 includes a cavity substrate 61, a cover substrate 62, and mounting apertures 76-79. The cover substrate 62 can be secured over the cavity substrate 61 using an adhesive, solder connections, and/or other suitable means of adhesion. A cavity 63 is formed in the cavity substrate 61. The cavity 63 is an opening through all the layers of the cavity substrate 61. The cavity 63 does not extend into the cover substrate 62, and the cover substrate 62 encloses the cavity 63 on one side.

When the lid 60, the base substrate 30, and the base 20 are secured together, the cavity 63 allows a clearance for the device 12. The cavity 63 can also be sized to allow a clearance for other passive and/or active components that may be electrically connected on the base substrate 30. The size and shape of the cavity 63 are provided as an example in FIG. 1, and other sizes and shapes of cavities can be incorporated into the cavity substrate 61 of the lid 60.

The cavity substrate 61 of the lid 60 also includes an RF input coupling trace 70, an RF output coupling trace 71, and bias coupling traces 72 and 73 on one side 80. The cavity substrate 61 shown in FIG. 1 is single-sided (i.e., one copper layer) and includes a number of copper traces on the one side 80, but the cavity substrate 61 can be a double-sided or multi-layer substrate, such as shown in FIGS. 3C and 3D and described below.

In one example, the RF input coupling trace 70 extends from a first edge 81 of the side 80 of the cavity substrate 61 to a perimeter of the cavity 63, and the RF output coupling trace 71 extends from a second edge 82 of the side 80 of the cavity substrate 61 to the perimeter of the cavity 63. In other examples, the outer ends of each of the RF coupling traces 70 and 71 can extend nearly or about to the edges 81 and 82 of the cavity substrate 61, respectively, and the inner ends of each of the RF coupling traces 70 and 71 can extend nearly or about to opposing sides of the perimeter of the cavity 63, respectively. However, the lengths and positions of the RF coupling traces 70 and 71 can vary among the embodiments. Similarly, the widths and thicknesses of the RF coupling traces 70 and 71 can vary as compared to that shown in FIG. 1.

The bias coupling traces 72 and 73 extend, respectively, from a third edge 83 and a fourth edge 84 of the side 80 of the cavity substrate 61 to the perimeter of the cavity 63. In other examples, the outer ends of each of the bias coupling traces 72 and 73 can extend nearly or about to the edges 83 and 84 of the cavity substrate 61, respectively, and the inner ends of each of the bias coupling traces 72 and 73 can extend nearly or about to opposing sides of the perimeter of the cavity 63, respectively. However, the lengths and positions of the bias coupling traces 72 and 73 can vary among the embodiments. Similarly, the widths and thicknesses of the bias coupling traces 72 and 73 can vary as compared to that shown in FIG. 1.

The mounting apertures 76-79 are openings through all the layers of the lid 60. In one example, mechanical fasteners, such as plastic or metal screws, can be passed through the mounting apertures 76-79 of the lid 60, through the mounting apertures 36-39 of the base substrate 30, and fastened into the threaded apertures 21-24 of the base 20. The number and positions of the mounting apertures 76-79 can vary from that shown in FIG. 1.

Figure 2:
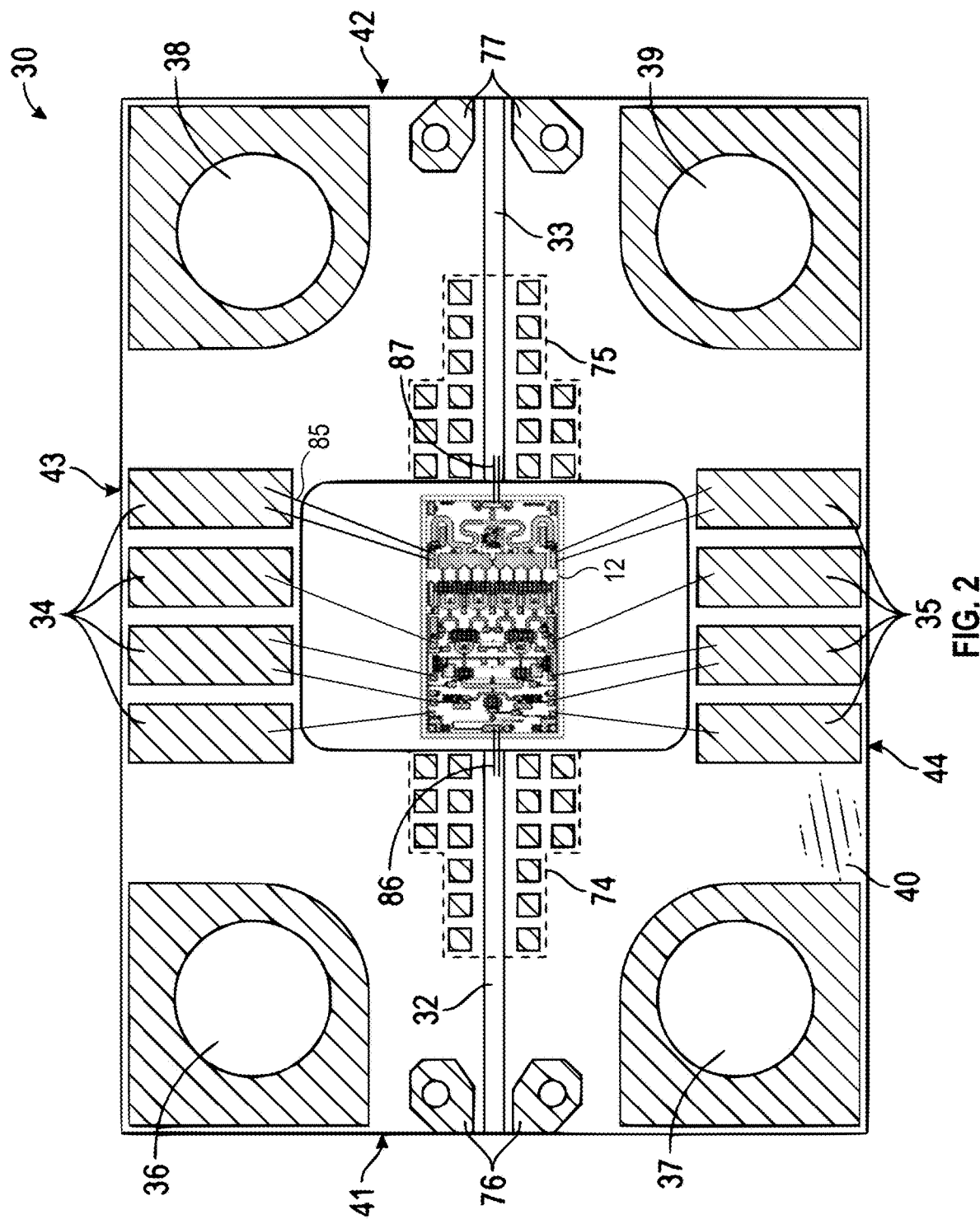
FIG. 2 illustrates a plan view of an example base substrate of the package shown in FIG. 1 according to various embodiments described herein.

FIG. 2 illustrates a plan view of the base substrate 30 according to various embodiments described herein. In addition to the aspects of the base substrate 30 referenced in FIG. 1 and described above, the base substrate 30 also includes the networks of compensation patches 74 and 75, and the test probe patches 76 and 77. The network of compensation patches 74 can provide an amount of capacitive compensation for RF input signals present on the RF input coupling trace 70. Similarly, the network of compensation patches 75 can provide an amount of capacitive compensation for RF output signals present on the RF output coupling trace 70. Each of the networks of compensation patches 74 and 75 can be embodied as an arrangement of square metal patches arranged along the RF input coupling trace 70 and the RF output coupling trace 71. The number, shapes, sizes, and positions of the metal patches can vary from that shown in FIG. 2. The test probe patches 76 and 77 can provide locations for coupling test probes during assembly and test of the package 10 with the device 12.

As best shown in FIG. 2, the RF input trace 32 extends from a first edge 41 of the side 40 of the base substrate 30 to a perimeter of the through hole 31, and the RF output trace 33 extends from a second edge 42 of the side 40 of the base substrate 30 to the perimeter of the through hole 31. However, the lengths, widths, thicknesses, and positions of the RF traces 32 and 33 can vary as compared to that shown. Further, the bias traces 34 and 35 extend, respectively, from a third edge 43 and a fourth edge 44 of the side 40 of the base substrate 30 to the perimeter of the through hole 31. However, the lengths, widths, thicknesses, and positions of the bias traces 34 and 35 can vary as compared to that shown.

During assembly of the package 10 with the device 12, bias inputs and outputs of the device 12 can be electrically coupled to the bias traces 34 and 35 on the base substrate 30 using one or more wire bonds 85. Similarly, the RF inputs and outputs of the device 12 can be electrically coupled to the RF input trace 32 and the RF output trace 33 on the base substrate 30, respectively, using one or more wire bonds 86 and 87.

Figure 3A:
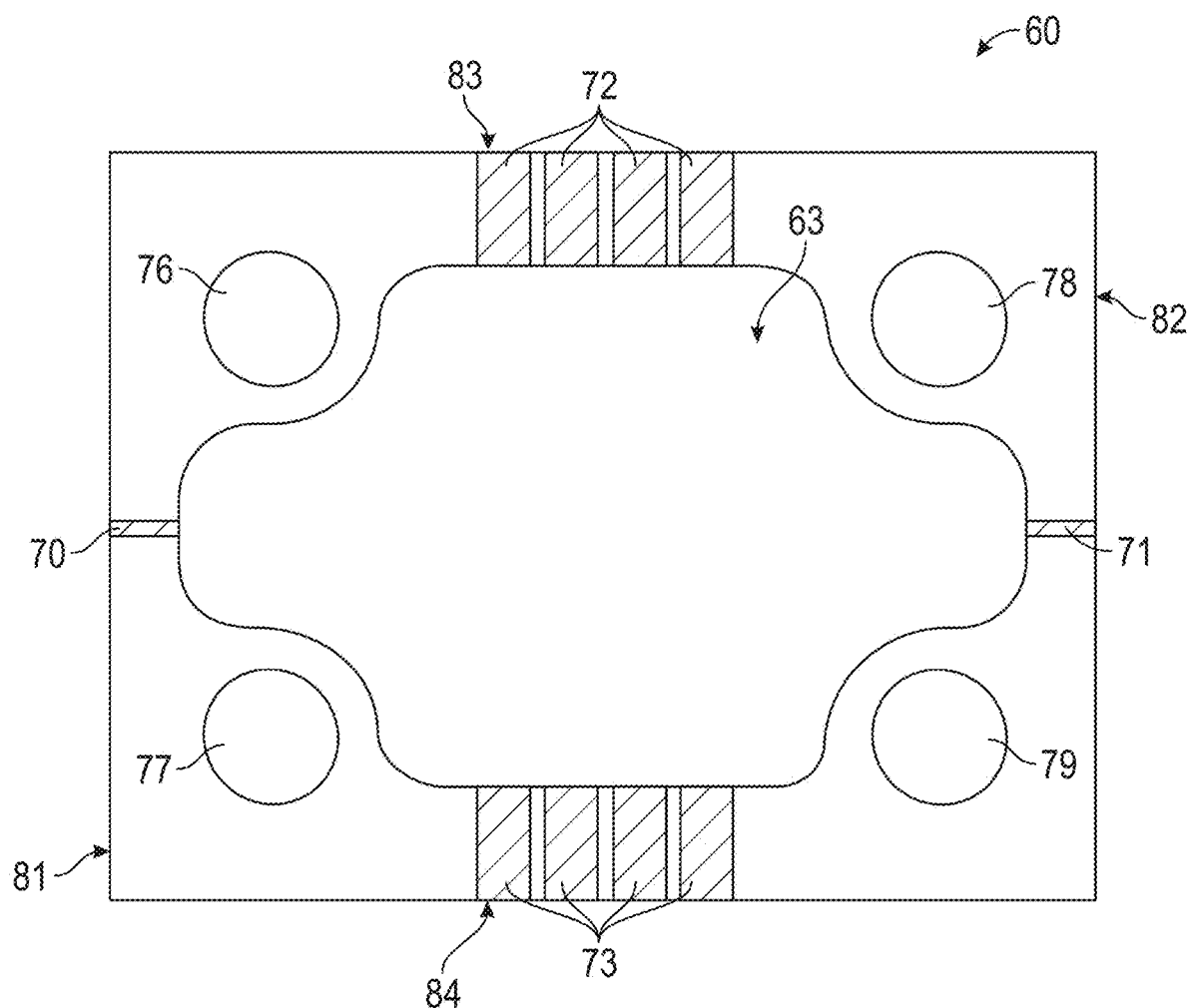
FIG. 3A illustrates a plan view of an example lid of the package shown in FIG. 1 according to various embodiments described herein.

FIG. 3A illustrates a plan view of the lid 60 according to various embodiments described herein. As best shown in FIG. 3A, the RF input coupling trace 70 extends from a first edge 81 of the side 80 of the cavity substrate 61 to a perimeter of the cavity 63, and the RF output coupling trace 71 extends from a second edge 82 of the side 80 of the cavity substrate 61 to the perimeter of the cavity 63. However, the lengths, widths, thicknesses, and positions of the RF coupling traces 70 and 71 can vary among the embodiments. The bias coupling traces 72 and 73 extend, respectively, from a third edge 83 and a fourth edge 84 of the side 80 of the cavity substrate 61 to the perimeter of the cavity 63. However, the lengths, widths, thicknesses, and positions of the bias coupling traces 72 and 73 can vary among the embodiments.

Figure 3B:
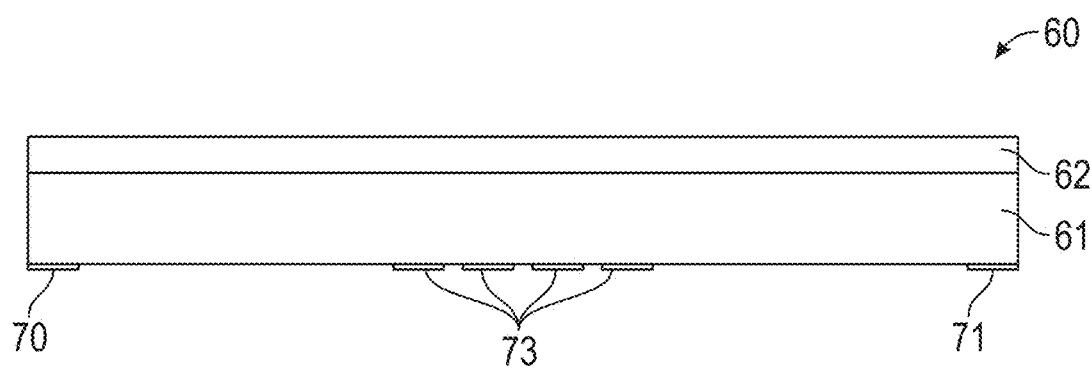
FIG. 3B illustrates a side view of the example lid shown in FIG. 3A according to various embodiments described herein.
Figure 3C:
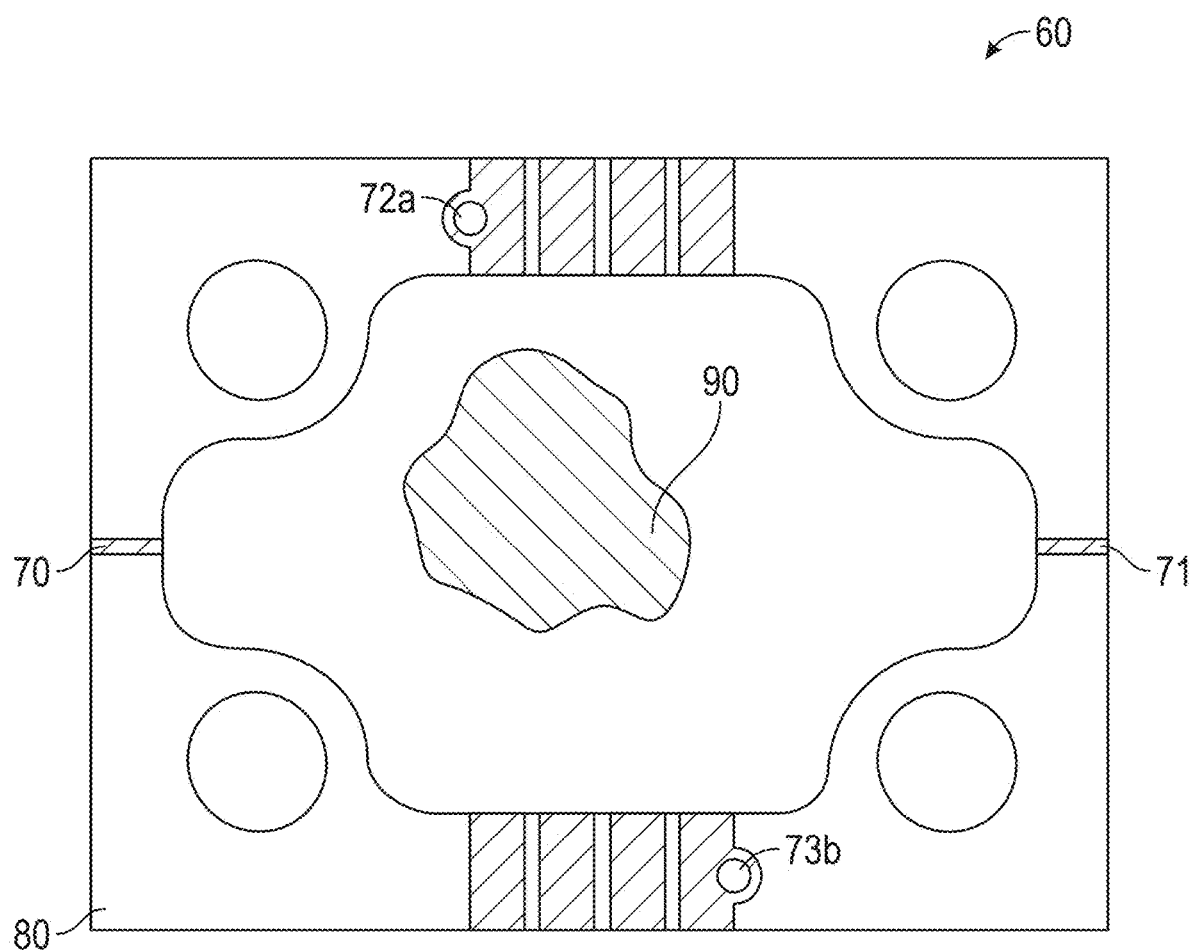
FIG. 3C illustrates a plan view of another example lid of the package shown in FIG. 1 according to various embodiments described herein.
Figure 3D:
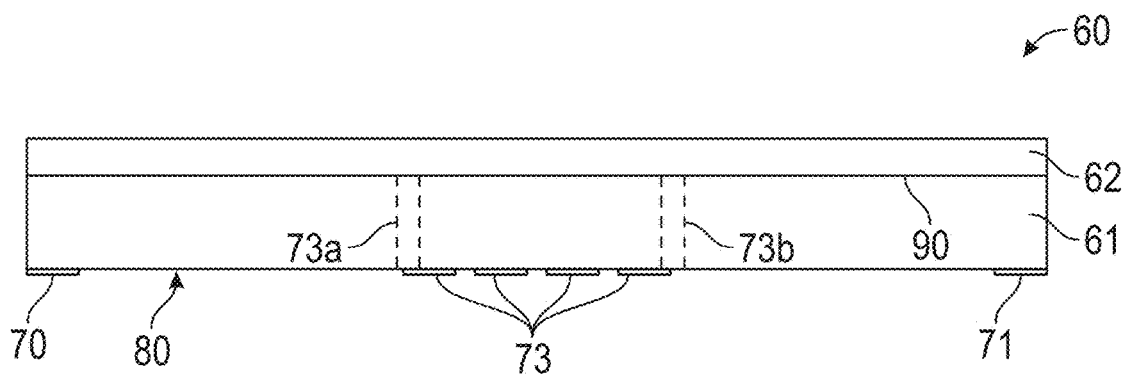
FIG. 3D illustrates a side view of the example lid shown in FIG. 3C according to various embodiments described herein.

FIG. 3B illustrates a side view of the lid 60 according to various embodiments described herein. As shown, the cover substrate 62 can be secured over the cavity substrate 61 using an adhesive or other suitable means of adhesion. The cavity 63 is formed in the cavity substrate 61 and does not extend into the cover substrate 62. The cover substrate 62 encloses the cavity 63 on one side.

FIG. 3C illustrates a plan view of another embodiment of the lid 60, and FIG. 3D illustrates a side view of the other embodiment of the lid 60 shown in FIG. 3C. Referring between FIGS. 3C and 3D, the lid 60 also includes an electromagnetic interference shield 90 formed on one side of the cover substrate 62. The electromagnetic interference shield 90 can be formed as a layer of metal on one side of the cover substrate 62. In various examples, the electromagnetic interference shield 90 can extend over all or substantially all of one or both major sides (or all sides and/or edges) of the cover substrate 62. In other cases, the electromagnetic interference shield 90 can be smaller and located at one or more regions of one side of the cover substrate 62. In still other cases, the electromagnetic interference shield 90 can be embodied as one or more metal strips, traces, or other features, located at one or more suitable locations on the cover substrate 62.

The electromagnetic interference shield 90 can be electrically coupled to one or more of the bias coupling traces 72 and 73, such as traces for ground, using one or both of the through vias 72a and 73b. As shown, the through vias 72a and 73b can extend through the cavity substrate 61 to electrically couple to the electromagnetic interference shield 90 on the cover substrate 62. The electromagnetic interference shield 90 can shield electromagnetic interference radiating from the device 12 from interfering with other components and/or prevent electromagnetic interference from other components from interfering with the device 12 or other components in the package 10. In other embodiments, the cover substrate 62 can include other signal traces, possibly electrically connected to other ones of the bias coupling traces 72 and 73 using through vias. In that way, components can also be secured and electrically connected to the cover substrate 62 within the cavity 63.

Figure 5:
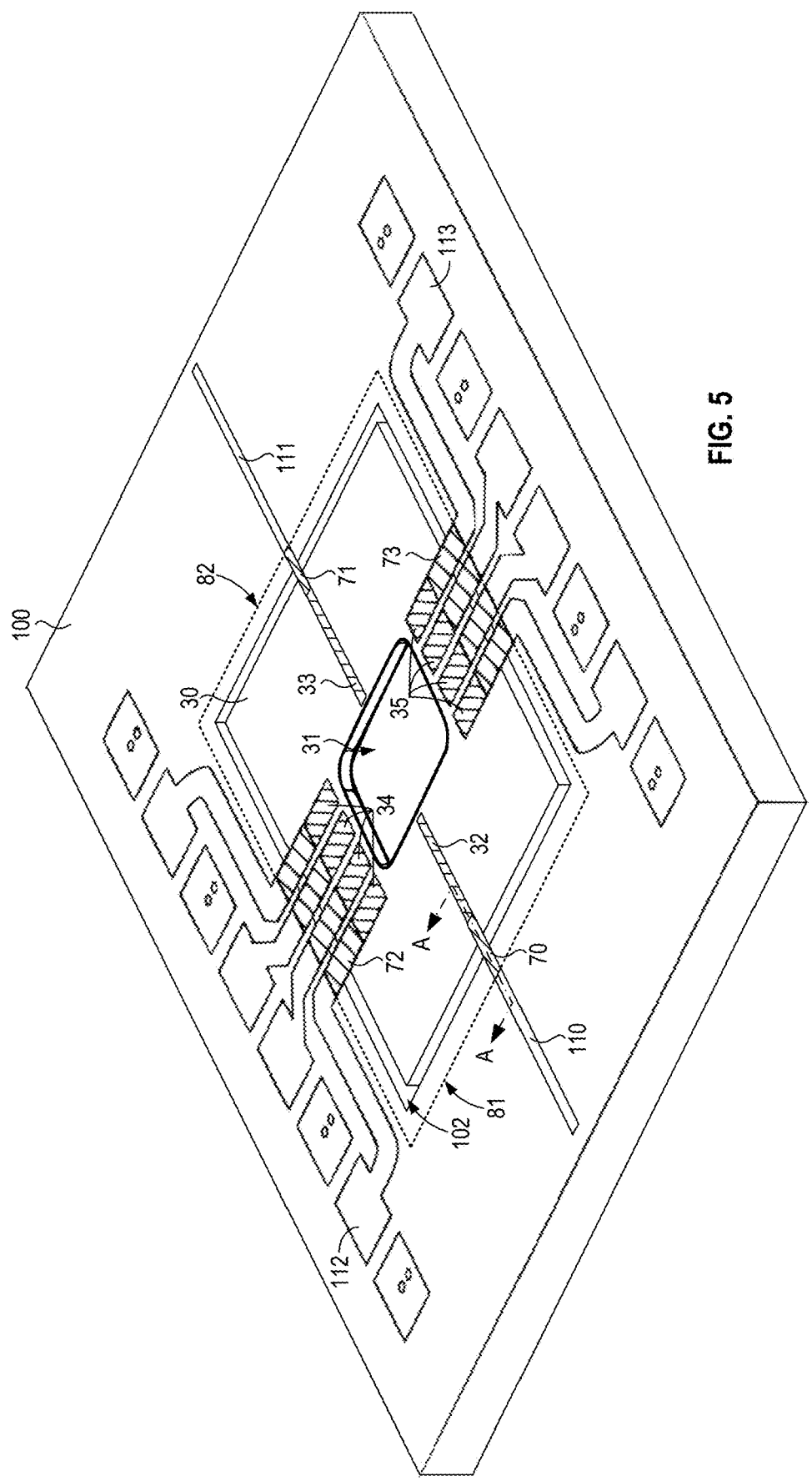
FIG. 5 illustrates a perspective view of the application circuit and the package shown in FIG. 1 according to various embodiments described herein.

FIG. 4 illustrates a cross-sectional side view, designated A-A in FIG. 5, of an application circuit 100 and the package 10 shown in FIG. 1. FIG. 5 illustrates a perspective view of the application circuit 100 and the package 10. FIG. 5 is drawn in a representative manner to convey the concepts described herein, and certain elements of the package 10 are omitted from view in FIG. 5. Particularly, the lid 60 of the package 10 is omitted from view in FIG. 5, although an outline of the side 80 of the lid 60 is shown using a dashed line, and the edges 81 and 82 of the lid 60 are identified.

The application circuit 100 can be embodied as a larger PCB to which the package 10 is electrically coupled. As shown in FIG. 5, the application circuit 100 includes traces 110-113 on one side and a central opening 102. The base substrate 30 is shown within the central opening 102. Although not visible in FIG. 5 (but shown in FIG. 4), the base 20 can also be placed within the opening 102.

As shown in FIG. 4, the package 10 is assembled with the base substrate 30 secured between the lid 60 and the base 20. It is clear that the cavity substrate 61 and the cover substrate 62 of the lid 60 are larger than and extend beyond the base substrate 30 and the base 20. When the package 10 is assembled, the RF input trace 32 on the base substrate 30 is electrically coupled to the RF input coupling trace 70 on the cavity substrate 61 of the lid 60. Solder, conductive epoxy, or another conductive substance or material can be used to electrically couple the RF input trace 32 to the RF input coupling trace 70. The RF output trace 33 and the bias traces 34 and 35 of the substrate 30 can also be electrically coupled, respectively, to the RF output coupling trace 71 and the bias coupling traces 72 and 73 of the lid 60 using solder, conductive epoxy, or another conductive substance or material.

Because the lid 60 is larger in dimension than the base substrate 30 and the base 20, the RF input coupling trace 70, RF output coupling trace 71, and bias coupling traces 72 and 73 of the lid 60 extend to some distance out from the sides or edges of the base substrate 30. Thus, as shown in FIG. 4, when assembled with the application circuit 100, at least part of the RF input coupling trace 70 that extends out from base substrate 30 can contact and electrically couple to a trace 110 on the application circuit 100, electrically coupling them together. Solder, conductive epoxy, or another conductive substance or material can be used to electrically couple the RF input coupling trace 70 on the lid 60 to the trace 110 on the application circuit 100. In this way, the lid 60 can be used to electrically couple the base substrate 30 to the application circuit 100. Particularly, the RF input trace 32, the RF output trace 33, and the bias traces 34 and 35 on the base substrate 30 can all be electrically coupled to corresponding traces on the application circuit 100 by the RF input coupling trace 70, the RF output coupling trace 71, and the bias coupling traces 72 and 73 on the lid 60.

FIGS. 4 and 5 are provided to illustrate the manner in which the lid 60 can electrically couple the RF input trace 32, the RF output trace 33, and the bias traces 34 and 35 of the substrate 30 to the traces 110-113 of the application circuit 100, respectively, through the RF input coupling trace 70, the RF output coupling trace 71, and the bias coupling traces 72 and 73 of the lid 60. As shown in FIG. 5, the RF input coupling trace 70, the RF output coupling trace 71, and the bias coupling traces 72 and 73 of the lid 60 span the central opening 102 between the RF input trace 32, the RF output trace 33, and the bias traces 34 and 35 of the substrate 30 and the traces 110-113 of the application circuit 100.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A package for a device, comprising:
a thermally conductive base;
a base substrate comprising a through hole, a radio frequency (RF) input trace that extends from a first edge of the base substrate to a perimeter of the through hole, an RF output trace that extends from a second edge of the base substrate to the perimeter of the through hole, and at least one bias trace that extends from a third edge of the base substrate to the perimeter of the through hole; and
a lid comprising a cavity, an RF input coupling trace, an RF output coupling trace, and at least one bias coupling trace, wherein
the RF input coupling trace, the RF output coupling trace, and the at least one bias coupling trace comprise exposed conductive traces formed on one side of the lid.

2. The package according to claim 1, wherein a peripheral footprint of the base substrate is smaller than a peripheral footprint of the lid.

3. The package according to claim 1, wherein the RF input trace, the RF output trace, and the at least one bias trace comprise exposed conductive traces formed on one side of the base substrate.

4. The package according to claim 1, wherein the lid is secured to the thermally conductive base, with the base substrate secured between the lid and the thermally conductive base, using at least one mechanical fastener.

5. The package according to claim 4, wherein, with the base substrate secured between the lid and the thermally conductive base, the RF input coupling trace, the RF output coupling trace, and the at least one bias coupling trace of the lid are electrically coupled, respectively, to the RF input trace, the RF output trace, and the at least one bias trace of the base substrate.

6. The package according to claim 4, wherein, with the base substrate secured between the lid and the thermally conductive base, the RF input coupling trace, the RF output coupling trace, and the at least one bias coupling trace of the lid extend beyond at least one of: the first edge, the second edge, and the third edge of the base substrate.

7. The package according to claim 1, wherein:
the lid comprises a cavity substrate and a cover substrate;
the cavity is formed as a through hole in the cavity substrate; and
the RF input coupling trace, the RF output coupling trace, and the at least one bias coupling trace are formed on one side of the cavity substrate.

8. The package according to claim 7, wherein an electromagnetic interference shield is formed on one side of the cover substrate.

9. The package according to claim 8, wherein the cavity substrate further includes at least one through via that electrically couples the at least one bias coupling trace on one side of the cavity substrate to the electromagnetic interference shield on the cover substrate.

10. A package for a device, comprising:
a base substrate comprising a through hole and at least one trace that extends from an edge of the base substrate to a perimeter of the through hole; and
a lid comprising a cavity substrate and a cover substrate, wherein the cavity substrate comprises a cavity and at least one bias coupling trace that extends from an edge of the cavity substrate to a perimeter of the cavity, wherein an electromagnetic interference shield is formed on one side of the cover substrate; and the cavity substrate further includes at least one through via that electrically couples the at least one bias coupling trace on one side of the cavity substrate to the electromagnetic interference shield on the cover substrate.

11. The package according to claim 10, wherein a peripheral footprint of the base substrate is smaller than a peripheral footprint of the lid.

12. The package according to claim 10, wherein the at least one trace of the base substrate comprises an RF input trace, an RF output trace, and at least one bias trace formed on one side of the base substrate.

13. The package according to claim 12, wherein the at least one bias coupling trace of the lid comprises an RF input coupling trace, an RF output coupling trace, and at least one bias coupling trace formed on one side of the lid.

14. The package according to claim 13, further comprising:

a thermally conductive base, wherein the lid is secured to the thermally conductive base with the base substrate secured between the lid and the thermally conductive base.

15. The package according to claim 14, wherein, with the base substrate secured between the lid and the thermally conductive base, the RF input coupling trace, the RF output coupling trace, and the at least one bias coupling trace of the lid are electrically coupled, respectively, to the RF input trace, the RF output trace, and the at least one bias trace of the base substrate.

16. The package according to claim 15, wherein, with the base substrate secured between the lid and the thermally conductive base, the RF input coupling trace, the RF output coupling trace, and the at least one bias coupling trace of the lid extend beyond the edge of the base substrate.

17. The package according to claim 16, wherein the RF input coupling trace, the RF output coupling trace, and the at least one bias coupling trace are formed on one side of the cavity substrate.

18. A package for a device, comprising:

a base substrate comprising a through hole, a radio frequency (RF) input trace that extends from a first edge of the base substrate to a perimeter of the through hole, an RF output trace that extends from a second edge of the base substrate to the perimeter of the through hole, and at least one bias trace that extends from a third edge of the base substrate to the perimeter of the through hole; and a lid comprising a cavity, an RF input coupling trace, an RF output coupling trace, and at least one bias coupling trace, wherein the RF input coupling trace, the RF output coupling trace, and the at least one bias coupling trace comprise exposed conductive traces formed on one side of the lid.

19. The package according to claim 18, wherein a peripheral footprint of the base substrate is smaller than a peripheral footprint of the lid.

20. The package according to claim 18, wherein the lid is secured to a thermally conductive base, with the base substrate secured between the lid and the thermally conductive base, using at least one mechanical fastener.

* * * * *